(12) United States Patent
Moon et al.

(10) Patent No.: US 6,700,199 B2
(45) Date of Patent: Mar. 2, 2004

(54) GOLD-SILVER BONDING WIRE FOR SEMICONDUCTOR DEVICE

(75) Inventors: Jeong-Tak Moon, Seongnam (KR); Jong-Soo Cho, Seoul (KR); Dong-Ho Joung, Yongin (KR)

(73) Assignee: MK Electron Co., Ltd., Yongin (KR)

( * ) Notice: Subject to any disclaimer, the term of this patent is extended or adjusted under 35 U.S.C. 154(b) by 0 days.

(21) Appl. No.: 10/384,027

(22) Filed: Mar. 7, 2003

(65) Prior Publication Data

US 2003/0209810 A1 Nov. 13, 2003

(30) Foreign Application Priority Data

May 7, 2002 (KR) ................. 10-2002-0024997

(51) Int. Cl.[7] .................. H01L 23/48; H01L 23/52; H01L 21/44; C22C 5/00; C22F 1/14
(52) U.S. Cl. .............. 257/741; 257/767; 257/768; 257/780; 438/611; 148/430; 148/678
(58) Field of Search ............ 257/672, 674, 257/698, 734, 737–739, 741–747, 761–770, 779, 784; 438/511; 148/430, 431, 678, 22–26, 442

(56) References Cited

U.S. PATENT DOCUMENTS

| | | | | |
|---|---|---|---|---|
| 5,702,814 A | * | 12/1997 | Hanada et al. ............... | 428/364 |
| 5,989,364 A | * | 11/1999 | Kitamura ................... | 148/430 |
| 6,103,025 A | * | 8/2000 | Herklotz et al. ............ | 148/650 |
| 6,150,262 A | * | 11/2000 | Go et al. .................... | 438/650 |

\* cited by examiner

Primary Examiner—Caridad Everhart
Assistant Examiner—Calvin Lee
(74) Attorney, Agent, or Firm—Volpe and Koenig, P.C.

(57) ABSTRACT

A gold-silver alloy bonding wire for a semiconductor device is provided. The bonding wire contains: a Au-Ag alloy including 5–40% Ag by weight in Au having a purity of 99.999% or greater; at least one element of a first group consisting of Pd, Rh, Pt, and Ir in an amount of about 50–10,000 ppm by weight; at least one element of a second group consisting of B, Be, and Ca in an amount of about 1–50 ppm by weight; at least one element of a third group consisting of P, Sb, and Bi in an amount of about 1–50 ppm by weight; and at least one element of a fourth group consisting of Mg, TI, Zn, and Sn in an amount of about 5–50 ppm by weight. The bonding wire is highly reliable with a strong tensile strength at room temperature and high temperature and favourable bondability. When the bonding wire is looped, no rupture occurs in a ball neck region. Also, no chip cracking occurs since the ball is soft.

8 Claims, 1 Drawing Sheet

GOLD-SILVER BONDING WIRE FOR SEMICONDUCTOR DEVICE

BACKGROUND OF THE INVENTION

1. Field of the Invention

The present invention relates to a bonding wire for electrically connecting a semiconductor chip and a lead frame or a printed circuit board (PCB) in a packaging process, and more particularly, to a bonding wire which does not cause chip cracks because it forms a soft ball.

2. Description of the Related Art

Referring to FIG. 1, a general semiconductor package includes a semiconductor chip 10 on a pad 50, a plurality of chip pads 20 formed on the semiconductor chip 10 as input/output ports for a variety of signals, a plurality of lead frames 40 electrically connected to the semiconductor chip 10 to receive the variety of signals from or to output the same to an external circuit; and a bonding wire 30 for electrically connecting the chip pad 20 and the lead frame 40. This structure of the general semiconductor package is protected by, for example, epoxy molding compound resin.

One end of the bonding wire 30 bound to the chip pad 20 includes a compressed ball 32 and a neck 34 as a connector between the compressed ball 32 and the bonding wire 30. In a wire bonding process, one end of the bonding wire 30 is melted by discharging to form a free air ball of a predetermined size and pressed on the chip pad 20 to be bound to the chip pad 20. A loop of the bonding wire 30 having an appropriate height and length is formed to reach a corresponding lead frame 40, and the other end of the bonding wire 30 is bound to the lead frame 40 with an application of pressure. As a result, the semiconductor chip 10 and the lead frame 40 are electrically connected.

A gold-silver (Au-Ag) alloy is typically used for the bonding wire 30. Silver forms a complete solid solution together with gold, so the alloy can be produced on a large scale, thereby lowering the manufacturing cost of the bonding wire. However, when a loop is formed with the conventional bonding wire 30, the bonding wire 30 often breaks near the neck 53, as indicated by reference numeral 35. A reduced loop height due to the increasing integration density of a semiconductor device further increases the breakage 35 of the neck 34. The breakage 35occurs due to a poor tensile strength of the bonding wire 30. Accordingly, a signal transmission path formed by the loop is opened. In addition, the poor strength of the bonding wire 30 causes a loop sagging or sweeping (indicated by reference numeral 36) in a molding process, so that adjacent loops contact one another.

Examples of research on the conventional Au-Ag bonding wire are in Japanese Laid-open Application Nos. 1998-326803, 1999-67811, and 1999-67812. According to the disclosures, to increase the bonding strength and to reduce the sweeping of the Au-Ag bonding wire in the molding process, cupper (Cu), palladium (Pd), or platinum (Pt) was added in an amount of 0.01–4% by weight, and at least one of calcium (Ca), beryllium (Be), and indium (In) was added in an amount of 0.0005–0.05% by weight. Japanese Laid-open Patent Application No. 2000-150562 disclosed that the addition of at least one of Pd, titanium (Ti), Ca, Be and lanthanum (La) in an amount of several parts per million to several percentages by weight results in a ball grain refinement and increases bonding strength after high-temperature heating.

However, the conventional techniques were inclined to increasing the bonding strength and reliability and to preventing the sweeping of the bonding wire in the molding process, ignoring a crucial chip crack due to the inherently hard ball of the Au-Ag alloy. In addition, the problem of the breakage occurring near the ball neck in the loop formation remains unsolved. Furthermore, the ball grain refinement in Japanese Laid-open Patent Application No. 2000-150562 increases the area of grain boundaries acting as Au and Ag atom diffusion paths, and thus it is likely to lower reliability.

SUMMARY OF THE INVENTION

Accordingly, it is an object of the present invention to provide a highly reliable bonding wire which has a strong tensile strength at both room temperature and high-temperature and causes no chip crack in a wire bonding process and no rupture of a ball neck when the bonding wire is looped.

In one aspect, the present invention provides a bonding wire for a semiconductor device, containing: a Au-Ag alloy including about 5–40% Ag by weight in Au having a purity of 99.999% or greater; at least one element of a first group consisting of Pd, Rh, Pt, and Ir in an amount of about 50–10,000 ppm by weight; at least one element of a second group consisting of B, Be, and Ca in an amount of about 1–50 ppm by weight; at least one element of a third group consisting of P, Sb, and Bi in an amount of about 1–50 ppm by weight; and at least one element of a fourth group consisting of Mg, TI, Zn, and Sn in an amount of about 5–50 ppm by weight. In the bonding wire according to the present invention, as many kinds of elements as possible from each of the first through fourth groups are added for synergism.

In the specification, the amounts of elements are expressed in ppm by weight and % by weight based on the total weight of the bonding wire.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

The major constituents of a gold-silver (Au-Ag) bonding wire according to the present invention are high-purity Au and Ag. The reason for using the Au-Al alloy for a bonding wire lies in cost reduction. Gold has small electrical resistance and is the best conductive material for signal transmission in an electronic circuit. Also, gold is highly ductile and malleable. However, gold is greatly affected by peripheral temperature variations and tends to expand at a high temperature. In addition, because the mechanical strength of gold is weak, when a gold bonding wire is applied to interconnects in a semiconductor package, wire loops forming the interconnects may sag or sweep. Accordingly, to provide a gold bonding wire with favourable characteristics while keeping the conductivity of gold, gold is alloyed or doped with other elements in percentages by weight or parts per million (ppm) by weight. When the purity of gold as a source material is less than 99.999%, the amount of an element added is limited, and there is no effect in adding the element due to the presence of impurities. A high-purity gold concentration of 99.999% or greater can be produced through two steps of purification, electrochemical purification and partial melting purification, to remove impurities. In the following, a reason explaining why it is necessary to limit a mixing ratio of elements added to obtain gold alloys and the characteristic of those elements will be described.

First Group of Elements

Figure 1:
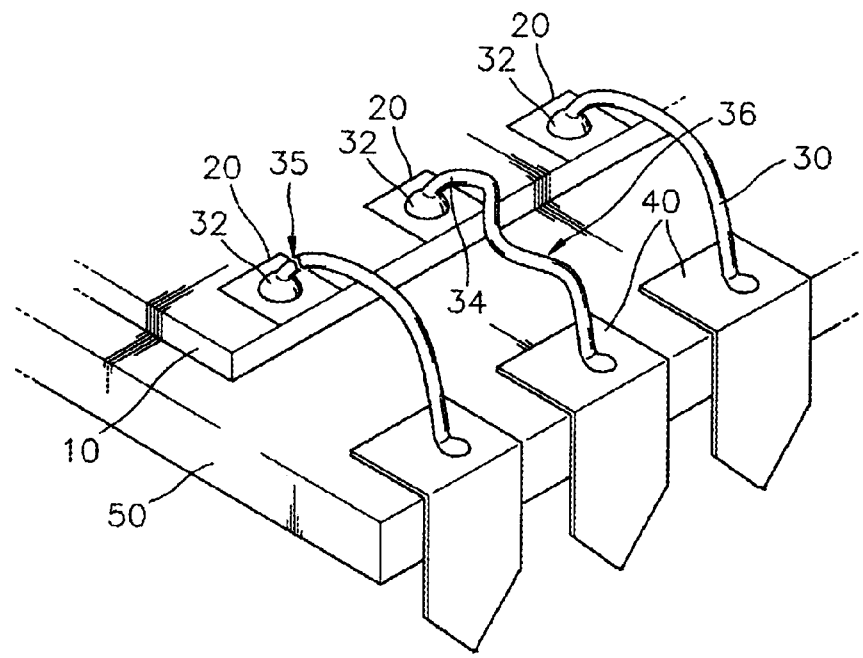
FIG. 1 shows the shapes of conventional bonding wire loops.

A first group of elements includes palladium (Pd), rhodium (Rh), platinum (Pt), and iridium (Ir). In general, the chip pad 20, as shown in FIG. 1, is formed of aluminium (Al). Accordingly, when a gold-silver (Au-Ag) alloy bonding wire is attached to the chip pad 20, the Au of the bonding wire diffuses into the chip pad 20, thereby resulting in a void near the neck 34. The elements of the first group according to the present invention form a barrier layer in the interface between a Au-rich region (bonding wire region) and an Al-rich region (chip pad region) after wire bonding, to prevent diffusion of Au and Ag atoms, thereby suppressing intermetallic compound and Kirkendall void formation. As a result, a reduction in thermal reliability is prevented.

The elements of the first group have good oxidation resistance, and thus enhance the tensile strength of the gold at room temperature and durability at high temperature when subjected to multiple thermal processes performed in the assembly of a semiconductor device. In addition, bonding reliability in a ball bonding process is improved.

According to the results of a variety of experiments, when the elements of the first group are added in an amount of less than 50 ppm by weight, there is no effect of improving thermal reliability. When the elements of the first group are added in an amount of greater than 10,000 ppm by weight, ball hardness is increased and chip cracks occur. Therefore, an appropriate amount of the first group elements is in a range of about 50–10,000 ppm by weight.

Second Group of Elements

A second group of elements includes boron (B), beryllium (Be), and calcium (Ca). The elements of the second group enhances tensile strength at room temperature and high temperature and suppresses bending or deformation of loops, such as sagging or sweeping, after loop formation. When an ultra low loop is formed, the elements of the second group increase yield strength near the ball neck, and thus reduce or prevent a rupture of the ball neck. Especially, when the bonding wire has a small diameter, a brittle failure near the ball neck can be suppressed.

When the elements of the second group are added in an amount of less than 1 ppm by weight, there is no effect in adding the elements. When the elements of the second group are added in an amount of greater than 50 ppm by weight, it is difficult to form a whole spherical free air ball due to dimple formation. Therefore, an appropriate amount of the second group elements is in a range of about 1–50 ppm by weight.

Third Group of Elements

A third group of elements includes phosphorous (P), antimony (Sb), and bismuth (Bi). The elements of the third group are uniformly dispersed in a Au solid solution to generate a stress field in the gold lattice and thus to enhance the strength of the gold at room temperature. The elements of the third group enhance the tensile strength of the bonding wire and effectively stabilize loop shape and reduce a loop height deviation. When the elements of the third group are added in an amount of less than 1 ppm by weight, there is no effect in adding the elements. When the elements of the third group are added in an amount of greater than 50 ppm by weight, the tensile strength is reduced, and thus it is likely to occur a brittle failure near the ball neck. Therefore, an appropriate amount of the third group elements is in a range of about 1–50 ppm by weight.

Fourth Group of Elements

A fourth group of elements includes magnesium (Mg), thallium (Tl), zinc (Zn), and tin (Sn). The elements of the fourth group suppress the grain refinement in a free air ball and soften the ball, thereby preventing chip cracking, which is a problem of Au-Ag alloys, and improving thermal reliability. Also, the elements of the fourth group enhance the tensile strength of the bonding wire and reduce or prevent a rupture of the ball neck when a ultra low loop is formed. When the elements of the fourth group are added in an amount of less than 5 ppm, there is no effect in adding the elements. When the elements of the fourth group are added in an amount of greater than 50 ppm, bonding reliability is lowered. Therefore, an appropriate amount of the fourth group elements is in a range of about 5–50 ppm by weight.

A bonding wire according to an embodiment of the present invention contains a Au-Ag alloy including about 5–40% silver by weight in Au having a purity of 99.999% or greater, at least one element of the first group consisting of Pd, Rh, Pt, and Ir in an amount of about 50–10000 ppm by weight, at least one element of the second group consisting of B, Be, and Ca in an amount of about 1–50 ppm by weight, at least one element of the third group consisting of P, Sb, and Bi in an amount of about 1–50 ppm by weight, and at least one element of the fourth group consisting of Mg, Tl, Zn, and Sn in an amount of about 5–50 ppm by weight.

A bonding wire according to another embodiment of the present invention necessarily contains about 15–30% silver by weight, Pd, Be, Ca, and Mg with the above composition.

A bonding wire according to still another embodiment of the present invention contains about 15–30% silver by weight, Pd and Pt each in an amount of about 500–1500 ppm by weight, B, Be, and Ca each in an amount of about 1–30 ppm by weight, P, Sb, and Bi each in an amount of about 3–30 ppm by weight, and Mg and Zn each in an amount of 3–30 ppm by weight.

A bonding wire according to yet still another embodiment of the present invention contains about 10–30% silver by weight, Pd in an amount of about 1,000–10,000 ppm by weight, Be and Ca each in an amount of about 5–20 ppm by weight, P and Bi each in an amount of about 5–20 ppm by weight, and Mg, Zn, and Sn each in an amount of about 5–20 ppm by weight. Another bonding wire according to the present invention contains about 10–30% silver by weight, Pd, Rh, Pt, and Ir each in an amount of about 100–10,000 ppm by weight, Be and Ca each in an amount of about 5–30 ppm by weight, Sb and Bi each in an amount of about 5–20 ppm by weight, and Mg and Sn each in an amount of about 5–30 ppm by weight.

A bonding wire according to another embodiment of the present invention contains about 10–30% silver by weight, Pd, Rh, and Pt each in an amount of about 100–1,000 ppm by weight, B, Be, and Ca each in an amount of about 2–30 ppm by weight, P and Bi each in an amount of about 5–20 ppm by weight, and Mg, Tl, Zn, and Sn each in an amount of about 3–30 ppm by weight. Alternatively, a bonding wire according to the present invention contains about 10–30% silver by weight, Pd and Pt each in an amount of about 500–10,000 ppm by weight, B, Be, and Ca each in an amount of about 2–30 ppm by weight, Sb and Bi each in an amount of about 5–20 ppm by weight, and Mg, Tl, and Zn each in an amount of about 3–20 ppm by weight.

In the following examples, Au-Ag bonding wires were formed with different added amounts of the above-listed elements. The following examples are for illustrative purposes and are not intended to limit the scope of the invention.

To gold of a 99.999% or greater purity, the above-listed elements were mixed in different ratios, as shown in Table 1 below, melted, and processed into Au rods through continuous casting. Next, the Au rods were subjected to a drawing process to reduce the cross-sectional area of the Au rods until Au alloy wires having a desired diameter were obtained. The diameter of the Au alloy wires was 25 μm. Next, the internal stress and curls of the wires were removed through annealing.

ment at a cross head speed of 10 mm/min and a gage length of 100 mm at 20° C.

The degree of loop sweeping was measured by molding the bonded chip and lead frame with an epoxy molding compound resin and imaging the same using transmission X-rays. A loop displacement in the direction in which the epoxy molding compound resin flows was measured, and a percentage of the loop displacement with respect to the distance between the chip pad and the lead frame was measured as the degree of loop sweeping.

The bondability after bonding and after a thermal process were measured using a ball shear test (BST). While a tip end

TABLE 1

| Example No. | Ag (Wt %) | First Group (Wt %) | | | | Second Group (ppm by weight) | | | Third Group (ppm by weight) | | | Fourth Group (ppm by weight) | | | |
|---|---|---|---|---|---|---|---|---|---|---|---|---|---|---|---|
| | | Pd | Rh | Pt | Ir | B | Be | Ca | P | Sb | Bi | Mg | Tl | Zn | Sn |
| Present Invention | | | | | | | | | | | | | | | |
| 1 | 1 | 0.5 | | 0.5 | | 10 | | | | | | | | | |
| 2 | 10 | 0.1 | | 0.1 | | 10 | 10 | | | | | | | | |
| 3 | 20 | 0.5 | 0.01 | 0.1 | | 10 | 10 | 10 | | | | | | | |
| 4 | 30 | 0.1 | | 0.1 | | 2 | 5 | 10 | 3 | 10 | 5 | 5 | | 10 | |
| 5 | 40 | 0.5 | | 0.1 | 0.01 | | 5 | 20 | | 10 | 10 | 10 | 5 | | |
| 6 | 30 | | | | | | | 10 | | | 5 | | 10 | | |
| 7 | 30 | 0.1 | | | | 5 | | 20 | | | | | | | |
| 8 | 30 | 0.5 | | | | | | | 5 | 5 | 10 | | | | |
| 9 | 30 | 1 | | | | | 5 | 20 | 5 | | 5 | 5 | | 5 | |
| 10 | 30 | 5 | | | | 5 | | 15 | | | | | | | |
| 11 | 30 | 0.5 | | 0.01 | | | 10 | | | | | 30 | | | |
| 12 | 30 | 0.5 | 0.01 | 0.01 | | | | | | | 50 | | | | |
| 13 | 30 | 0.5 | | 0.01 | 0.01 | | | 50 | | | | | | | |
| 14 | 30 | 0.5 | 0.01 | | 0.1 | 2 | 5 | 10 | | | 10 | 10 | | 10 | |
| 15 | 30 | 0.5 | 0.01 | 0.01 | 0.01 | | 5 | 20 | | 10 | | 20 | 10 | | 10 |
| 16 | 30 | 0.5 | 0.05 | | | | | 30 | 10 | | 5 | 30 | 10 | | |
| 17 | 30 | 0.5 | | 0.05 | | 5 | | | | 5 | 10 | 20 | | 20 | |
| 18 | 30 | 0.5 | | 0.05 | 0.05 | 10 | 10 | | 10 | | 20 | 20 | | | 30 |
| 19 | 30 | 0.5 | 0.1 | 0.1 | | 15 | | 10 | 20 | | 30 | | | | |
| 20 | 30 | 0.5 | | 1 | | | | | | | | 10 | 10 | 10 | 10 |
| 21 | 30 | 1 | | 0.01 | | | 5 | 10 | | 10 | 10 | 10 | | 10 | |
| 22 | 30 | 1 | 0.01 | 0.01 | | | | | 5 | | 10 | | | | |
| 23 | 30 | 1 | | 0.01 | 0.01 | | 10 | 20 | | | | | | | |
| 24 | 30 | 1 | | 0.05 | | 5 | | 5 | | | | | | | |
| 25 | 30 | 1 | 0.05 | 0.05 | | 2 | 7 | 15 | 5 | | 10 | 5 | 5 | 5 | 5 |
| 26 | 30 | 1 | | 0.05 | 0.05 | | | | | | | | | | |
| 27 | 30 | 1 | | 0.1 | | 4 | 5 | 20 | | 10 | 10 | 10 | 10 | | 5 |
| 28 | 30 | 1 | 0.1 | 0.1 | | | | 30 | | | | 30 | | | |
| 29 | 30 | 1 | | 0.1 | 0.1 | | 20 | 20 | | | 30 | | | | |
| 30 | 30 | 1 | | 0.5 | | 10 | 10 | 10 | | | | 5 | 5 | 10 | 10 |
| 31 | 30 | 1 | 0.5 | 0.5 | | | | | 10 | 10 | 10 | | | | |
| 32 | 30 | 1 | | 1 | 1 | | 5 | 10 | 10 | 20 | 10 | | | | |
| 33 | 30 | 1 | 1 | 1 | 1 | 20 | | 50 | | | | 30 | | | |
| 34 | 30 | 1 | | 5 | | | | 80 | | | | | | | |
| Comparative Example | | | | | | | | | | | | | | | |
| 35 | 53 | 0.1 | | | | | | | | | | 20 | 5 | 10 | |
| 36 | 4 | | | | | | | 20 | | | | | | | |
| 37 | 15 | 0.03 | | | | | | | | | | | | | |
| 38 | 45 | | 1 | 0.002 | | | | | | | | | | | |
| 39 | 30 | 1 | | 1 | | | | 50 | | | | | | | |
| 40 | 10 | 1 | | | | | 5 | 20 | | | | | | | |

With the bonding wires prepared in the compositions of Table 1, the following experimental results in Table 2 were obtained. As shown in Table 2, tensile strength as a mechanical characteristic of the bonding wires, degree of loop sweeping, bondability after bonding and after a thermal process, loop height deviation, loop shape, ball shape, and ball hardness were measured.

The tensile strength was measured with respect to breaking load and elongation using an AND RTC 1150A instruwas placed 5 μm above the chip pad, the tip was horizontally moved to push a ball region at a speed of 0.5 mm/sec. The bondability was measured in grams.

The loop shape and ball shape were evaluated using three levels, excellent (⊚), good (o), and moderate (Δ). The ball shape was observed using an optical microscope and a scanning electron microscope to determine whether an oxide was deposited on the ball surface or whether ball distortion occurred.

The ball hardness was measured using the Micro Vicker's hardness method. The test load was 3 g, and the load duration was 12 seconds.

invention, but merely to 51 g for the conventional bonding wire. Apparently, the bonding wires according to the present invention have enhanced bondability.

TABLE 2

| Example No. | Tensile Strength (MPa) | Degree of Sweeping (%) | Bondability (BST, g) After bonding | Bondability (BST, g) After heating at 175° C. for 1000 hrs | Loop Height Deviation | Loop Shape | Ball Shape | Ball Hardness (Hv.) |
|---|---|---|---|---|---|---|---|---|
| Present Invention | | | | | | | | |
| 1  | 252 | 6.2 | 52 | 54 | 7.5 | ○ | ◎ | 60 |
| 2  | 265 | 5.4 | 54 | 57 | 6.1 | ○ | ◎ | 62 |
| 3  | 283 | 4.7 | 56 | 61 | 5.4 | ○ | ○ | 63 |
| 4  | 312 | 3.5 | 52 | 58 | 2.2 | ◎ | ○ | 63 |
| 5  | 304 | 3.9 | 50 | 58 | 2.5 | ○ | ○ | 65 |
| 6  | 245 | 7.1 | 48 | 42 | 6.0 | ○ | ◎ | 58 |
| 7  | 285 | 4.5 | 54 | 58 | 5.5 | ○ | ◎ | 59 |
| 8  | 274 | 5.7 | 55 | 60 | 2.9 | ◎ | ◎ | 57 |
| 9  | 315 | 2.7 | 57 | 64 | 3.2 | ◎ | ◎ | 56 |
| 10 | 288 | 4.7 | 56 | 61 | 5.7 | ○ | ◎ | 58 |
| 11 | 282 | 5.6 | 54 | 57 | 5.6 | ○ | ◎ | 55 |
| 12 | 280 | 5.2 | 53 | 55 | 4.0 | ◎ | ◎ | 60 |
| 13 | 302 | 3.4 | 52 | 53 | 5.3 | ○ | △ | 65 |
| 14 | 300 | 3.6 | 57 | 60 | 4.2 | ◎ | ◎ | 58 |
| 15 | 311 | 2.8 | 60 | 65 | 2.7 | ○ | ◎ | 58 |
| 16 | 305 | 3.1 | 58 | 64 | 2.9 | ○ | ◎ | 59 |
| 17 | 287 | 4.1 | 62 | 68 | 2.3 | ○ | ◎ | 57 |
| 18 | 293 | 3.7 | 55 | 56 | 1.9 | ○ | ○ | 57 |
| 19 | 285 | 4.5 | 50 | 53 | 1.7 | ○ | △ | 65 |
| 20 | 283 | 4.9 | 60 | 64 | 3.4 | ○ | ◎ | 55 |
| 21 | 290 | 4.1 | 61 | 62 | 2.7 | ◎ | ○ | 57 |
| 22 | 275 | 5.1 | 52 | 58 | 2.9 | ◎ | ◎ | 60 |
| 23 | 288 | 4.3 | 58 | 61 | 4.1 | ◎ | ◎ | 61 |
| 24 | 283 | 4.5 | 52 | 54 | 2.9 | ○ | ○ | 60 |
| 25 | 317 | 2.9 | 65 | 69 | 1.5 | ◎ | ◎ | 56 |
| 26 | 267 | 5.1 | 51 | 54 | 5.6 | ○ | ◎ | 56 |
| 27 | 308 | 3.1 | 64 | 68 | 1.6 | ◎ | ◎ | 56 |
| 28 | 287 | 4.7 | 59 | 61 | 4.6 | ○ | ○ | 57 |
| 29 | 294 | 3.9 | 61 | 62 | 2.6 | ◎ | ○ | 60 |
| 30 | 295 | 3.9 | 62 | 65 | 3.6 | ○ | ○ | 58 |
| 31 | 276 | 4.8 | 60 | 64 | 2.2 | ◎ | ◎ | 60 |
| 32 | 289 | 4.2 | 62 | 66 | 1.9 | ◎ | ◎ | 62 |
| 33 | 290 | 4.0 | 58 | 60 | 3.8 | ○ | △ | 61 |
| 34 | 292 | 3.9 | 47 | 49 | 3.2 | ○ | △ | 64 |
| Comparative Example | | | | | | | | |
| 35 | 283 | 5.3 | 42 | 45 | 7.2 | ○ | ◎ | 58 |
| 36 | 252 | 6.0 | 48 | 48 | 6.5 | ○ | ◎ | 62 |
| 37 | 247 | 6.7 | 50 | 51 | 7.2 | ○ | ◎ | 59 |
| 38 | 263 | 5.5 | 46 | 43 | 5.9 | ○ | ◎ | 60 |
| 39 | 284 | 4.3 | 45 | 48 | 7.8 | ○ | △ | 68 |
| 40 | 275 | 5.2 | 48 | 51 | 6.9 | ○ | ◎ | 65 |

As shown in Table 2, the bonding wire according to the present invention in Example 25 had the maximum bonding strength of 317 MPa, which is much greater than the conventional bonding wire in Comparative Example 39 having the maximum bonding strength of 284 MPa.

The degree of loop sweeping was the lowest at 2.7% for the bonding wire in Example 9 according to the present invention. Mostly, the degrees of loop sweeping in the bonding wires according to the present invention were low at about 6%, except or the bonding wire in Example 6. For the conventional bonding wires, the degree of loop sweeping was the lowest at 4.3% in Comparative Example 39 and the greatest at 6.7% in Comparative Example 37. Evidently, the degree of loop sweeping is comparatively lowered in the present invention than in the conventional bonding wires.

The maximum bondability immediately after bonding was 65 g in Example 25 and 50 g in Comparative Example 37. The bondability was improved after thermal treatment up to 69 g for the bonding wire according to the present The lowest loop height deviation was 1.5 for the bonding wire in Example 25 according to the present invention, but 5.9 for the conventional bonding wire in Comparative Example 38.

Most of the bonding wires according to the present invention were evaluated to be excellent in loop shape and ball shape.

For the bonding wires according to the present invention, the minimum ball hardness was 55 Hv. in Example 1, and the maximum ball hardness was 65 Hv. in Example 5. For the conventional bonding wires, the minimum ball hardness was 58 Hv. in Comparative Example 37, and the maximum ball hardness was 68 Hv. in Comparative Example 39. According to the present invention, the ball hardness is stably maintained to be small without a great variation. Also, since the boding wires according to the present invention are relatively soft, chip cracking is prevented.

The bonding wire in Comparative Example 35, which shows poor characteristics, were formed with the addition of excess silver of 40% or greater by weight.

The bonding wire in Example 25, which was evaluated to be excellent in terms of many characteristics, contains 30% silver, 1% Pd, 0.05% Rh, 0.05% Pt, which belong to the first group, 2 ppm B, 7 ppm Be, 15 ppm Ca, which belong to the second group, 5 ppm P and 10 ppm Bi, which belong to the third group, and 5 ppm Mg, 5 ppm TI, 5 ppm Sn, and 5 ppm Zn, which belong to the fourth group, wherein all constituents were measured on a weight basis. As is apparent from Table 2, the bonding wires in Examples 4, 9, 15, and 27 are regarded to be suitable for use.

Figure 2:
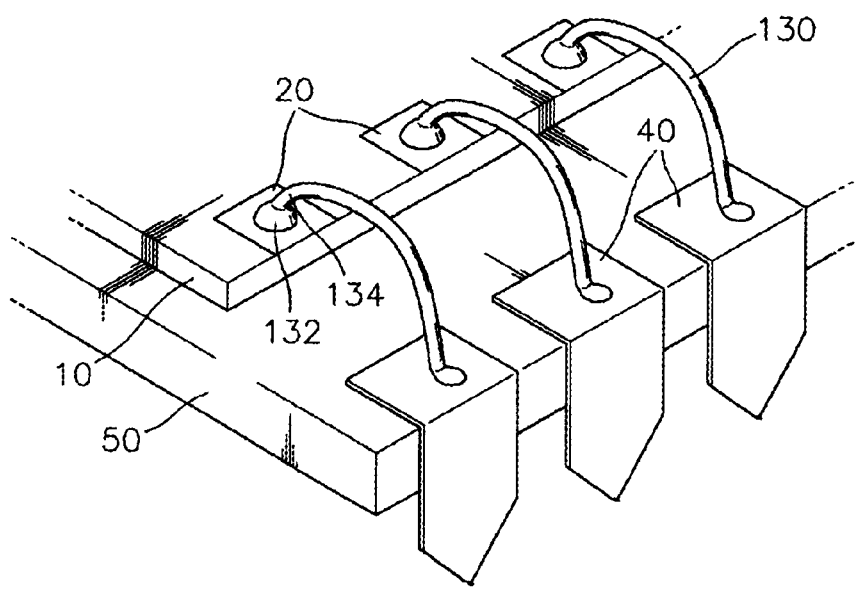
FIG. 2 shows the shape of bonding wire loops according to the present invention.

When a bonding wire formed as described above is looped, the loop shape is maintained without sagging due to the strong tensile strength, and the loop sweeping is reduced to lower the probability that a short circuit occurs due to electrical contact with adjacent loops, as described above. The ball shape is also favourable. FIG. 2 shows the loop shape of bonding wires 130 according to the present invention. The bonding wires 130 electrically connect a plurality of chip pads 20 on a semiconductor chip 10 mounted on a pad 50 and a plurality of lead frames 40. After being bound to the chip pad 20, the bonding wire 130 has a compressed ball 132 and a neck 134 connecting the boning wire 130 and the compressed ball 132. According to the present invention, the bonding wire 130 can be smoothly looped without a breakage of the neck 134. The loop shape is favourably maintained without sagging or sweeping.

As described above, a Au-Ag alloy bonding wire according to the present invention has a lot of synergy between the added elements. Also, the free air ball is softer than conventional one, so chip cracking nearly does not occur during a wire bonding process. Even when an ultra low loop is formed with the bonding wire according to the present invention, almost no breakage occurs near the neck.

According to the present invention, ball grain refinements are suppressed to reduce the grain area, thereby reducing an atomic diffusion path between Au and Ag. Accordingly, intermetallic compound and Kirkendall void formation is suppressed, thereby improving thermal stability.

The bonding wire according to the present invention has a strong tensile strength at room temperature and high temperature, and the loop shape after bonding is constantly maintained. In addition, the adhesion between the bonding wire and the chip pad is excellent and is maintained even after a high-temperature process for a long period of time. The ball shape, loop height deviation, and thermal stability of the bonding wire according to the present invention are favourable, and thus the bonding wire according to the present invention has wide industrial applications in forming electrical interconnection in semiconductor packages.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A bonding wire for a semiconductor device, containing:
   a Au-Ag alloy including 5–40% Ag by weight in Au having a purity of 99.999% or greater;
   at least one element of a first group consisting of Pd, Rh, Pt, and Ir in an amount of about 50–10,000 ppm by weight;
   at least one element of a second group consisting of B, Be, and Ca in an amount of about 1–50 ppm by weight;
   at least one element of a third group consisting of P, Sb, and Bi in an amount of about 1–50 ppm by weight; and
   at least one element of a fourth group consisting of Mg, TI, Zn, and Sn in an amount of about 5–50 ppm by weight.

2. The bonding wire of claim 1, wherein as many kinds of elements as possible from each of the first through fourth groups are added for synergism.

3. The bonding wire of claim 1, essentially containing 15–30% Ag by weight, Pd, Be, Ca, and Mg.

4. The bonding wire of claim 1, containing:
   15–30% Ag by weight;
   Pd and Pt each in an amount of about 500–1,500 ppm by weight;
   B, Be, and Ca each in an amount of about 1–30 ppm by weight;
   P, Sb, and Bi each in an amount of about 3–30 ppm by weight; and
   Mg and Zn each in an amount of 3–30 ppm by weight.

5. The bonding wire of claim 1, containing:
   10–30% Ag by weight;
   Pd in an amount of about 1,000–10,000 ppm by weight;
   Be and Ca each in an amount of about 5–20 ppm by weight;
   P and Bi each in an amount of about 5–20 ppm by weight; and
   Mg, Zn, and Sn each in an amount of about 5–20 ppm by weight.

6. The bonding wire of claim 1, containing:
   10–30% Ag by weight;
   Pd, Rh, Pt, and Ir each in an amount of about 100–10,000 ppm by weight;
   Be and Ca each in an amount of about 5–30 ppm by weight;
   Sb and Bi each in an amount of about 5–20 ppm by weight; and
   Mg and Sn each in an amount of about 5–30 ppm by weight.

7. The bonding wire of claim 1, containing:
   10–30% Ag by weight;
   Pd, Rh, and Pt each in an amount of about 100–10,000 ppm by weight;
   B, Be, and Ca each in an amount of about 2–30 ppm by weight;
   P and Bi each in an amount of about 5–20 ppm by weight; and
   Mg, TI, Zn, and Sn each in an amount of about 3–30 ppm by weight.

8. The bonding wire of claim 1, containing:
   10–30% Ag by weight;
   Pd and Pt each in an amount of about 500–10,000 ppm by weight;
   B, Be, and Ca each in an amount of about 2–30 ppm by weight;
   Sb and Bi each in an amount of about 5–20 ppm by weight; and
   Mg, TI, and Zn each in an amount of about 3–20 ppm by weight.

* * * * *